United States Patent
Gentile et al.

(10) Patent No.: US 10,999,917 B2
(45) Date of Patent: May 4, 2021

(54) SPARSE LASER ETCH ANODIZED SURFACE FOR COSMETIC GROUNDING

(71) Applicant: Apple Inc., Cupertino, CA (US)

(72) Inventors: Rhett D. Gentile, Santa Monica, CA (US); Peter N. Jeziorek, San Jose, CA (US); Sunita Venkatesh, San Francisco, CA (US); Lauren M. Farrell, Mountain View, CA (US); Steven J. Osborne, San Jose, CA (US)

(73) Assignee: Apple Inc., Cupertino, CA (US)

( * ) Notice: Subject to any disclaimer, the term of this patent is extended or adjusted under 35 U.S.C. 154(b) by 196 days.

(21) Appl. No.: 16/409,455

(22) Filed: May 10, 2019

(65) Prior Publication Data

US 2020/0100349 A1    Mar. 26, 2020

Related U.S. Application Data

(60) Provisional application No. 62/733,855, filed on Sep. 20, 2018.

(51) Int. Cl.
| | | |
|---|---|---|
| *H05F 3/02* | (2006.01) | |
| *H05K 5/02* | (2006.01) | |
| *H05K 5/00* | (2006.01) | |

(52) U.S. Cl.
CPC ............ *H05F 3/02* (2013.01); *H05K 5/0017* (2013.01); *H05K 5/0234* (2013.01); *H05K 5/0243* (2013.01)

(58) Field of Classification Search
CPC .. F16M 11/2021; F16M 11/041; F16M 11/10; F16M 2200/02; H05K 5/0234;

(Continued)

(56) References Cited

U.S. PATENT DOCUMENTS 2,647,079 A    7/1953  Burnham
2,812,295 A    11/1957 Patrick
(Continued)

FOREIGN PATENT DOCUMENTS

CN    1362125 A    8/2002
CN    1306526 C    3/2007
(Continued)

OTHER PUBLICATIONS

Annerfors et al., "Nano Molding Technology on Cosmetic Aluminum Parts in Mobile Phones", Division of Production and Materials Engineering, LTH, 2007.
(Continued)

*Primary Examiner* — Kevin J Comber
(74) *Attorney, Agent, or Firm* — Kilpatrick, Townsend and Stockton LLP

(57) ABSTRACT

A aesthetically appealing mounting system for an electronic device capable of forming a semi-conductive path for electro-static discharge. The mounting system can include an electrically conductive layer covered by a cosmetic anodized layer with multiple micro-perforations formed through the anodized layer exposing a small portion of the electrically conductive layer. The micro-perforations can be formed by laser-etching the cosmetic anodized layer to provide a grounding path while the micro-perforations remain visually undetectable. A semi-conductive wear layer can be configured to couple with the anodized layer. In some embodiments, the semi-conductive wear layer is in a recess on an electronic device. In some embodiments, the semi-conductive wear layer is comprised of a conformal conductive rubber.

20 Claims, 7 Drawing Sheets

(58) Field of Classification Search
CPC .... H05K 5/0243; H05K 5/0017; G06F 1/182; G06F 1/1601; G06F 1/1656; G06F 2200/1612; H05F 3/02
USPC .......................................................... 361/220
See application file for complete search history.

(56) References Cited

U.S. PATENT DOCUMENTS

| | | | |
|---|---|---|---|
| 2,990,304 A | 7/1961 | Cybriwsky et al. | |
| 3,216,866 A | 11/1965 | Orlin | |
| 3,526,694 A | 9/1970 | Lemelson | |
| 3,645,777 A | 2/1972 | Sierad | |
| 4,153,988 A * | 5/1979 | Doo | H01L 23/642 29/827 |
| 4,247,600 A | 1/1981 | Adachi | |
| 4,269,947 A | 5/1981 | Inata et al. | |
| 4,531,705 A | 7/1985 | Nakagawa et al. | |
| 4,547,649 A | 10/1985 | Butt et al. | |
| 4,564,001 A | 1/1986 | Maeda | |
| 4,756,771 A | 7/1988 | Brodalla et al. | |
| 4,931,366 A | 6/1990 | Mullaney, Jr. | |
| 4,993,148 A | 2/1991 | Adachi et al. | |
| 5,224,197 A | 6/1993 | Zanoni et al. | |
| 5,288,344 A | 2/1994 | Peker et al. | |
| 5,417,905 A | 5/1995 | Lemaire et al. | |
| 5,645,964 A | 7/1997 | Nohr et al. | |
| 5,808,268 A | 9/1998 | Balz et al. | |
| 5,837,086 A | 11/1998 | Leeb et al. | |
| 5,872,699 A | 2/1999 | Nishii et al. | |
| 5,925,847 A | 7/1999 | Rademacher et al. | |
| 6,007,929 A | 12/1999 | Robertson et al. | |
| 6,101,372 A | 8/2000 | Kubo | |
| 6,169,266 B1 | 1/2001 | Hughes | |
| 6,325,868 B1 | 12/2001 | Kim et al. | |
| 6,331,239 B1 | 12/2001 | Shirota et al. | |
| 6,480,397 B1 | 11/2002 | Hsu et al. | |
| 6,540,867 B1 | 1/2003 | Cochran | |
| 6,574,096 B1 | 6/2003 | Difonzo et al. | |
| 6,590,183 B1 | 7/2003 | Yeo | |
| 6,633,019 B1 | 10/2003 | Gray | |
| 6,746,724 B1 | 6/2004 | Robertson et al. | |
| 6,966,133 B2 | 11/2005 | Krings et al. | |
| 6,996,425 B2 | 2/2006 | Watanabe | |
| 7,134,198 B2 | 11/2006 | Nakatani et al. | |
| 7,181,172 B2 | 2/2007 | Sullivan et al. | |
| 7,225,529 B2 | 6/2007 | Wang | |
| 7,459,373 B2 | 12/2008 | Yoo | |
| 7,508,644 B2 | 3/2009 | Cheung et al. | |
| 7,622,183 B2 | 11/2009 | Shirai et al. | |
| 7,636,974 B2 | 12/2009 | Meschter et al. | |
| 7,691,189 B2 | 4/2010 | En et al. | |
| 8,192,815 B2 | 6/2012 | Weber et al. | |
| 8,367,304 B2 | 2/2013 | Heley et al. | |
| 8,379,678 B2 | 2/2013 | Zhang et al. | |
| 8,379,679 B2 | 2/2013 | Zhang et al. | |
| 8,451,873 B2 | 5/2013 | Zhang | |
| 2001/0030002 A1 | 10/2001 | Zheng et al. | |
| 2002/0058737 A1 | 5/2002 | Nishiwaki et al. | |
| 2002/0097440 A1 | 7/2002 | Paricio | |
| 2002/0109134 A1 | 8/2002 | Iwasaki et al. | |
| 2002/0130441 A1 | 9/2002 | Robinson et al. | |
| 2002/0160145 A1 | 10/2002 | Bauhoff | |
| 2003/0006217 A1 | 1/2003 | Dance | |
| 2003/0024898 A1 | 2/2003 | Natsume et al. | |
| 2005/0023022 A1 | 2/2005 | Kriege et al. | |
| 2005/0034301 A1 | 2/2005 | Wang | |
| 2005/0115840 A1 | 6/2005 | Dolan | |
| 2005/0158576 A1 | 7/2005 | Groll | |
| 2005/0263418 A1 | 12/2005 | Bastus Cortes | |
| 2006/0055084 A1 | 3/2006 | Yamaguchi et al. | |
| 2006/0066771 A1 | 3/2006 | Hayano et al. | |
| 2006/0105542 A1 | 5/2006 | Yoo | |
| 2007/0018817 A1 | 1/2007 | Marmaropoulos et al. | |
| 2007/0045893 A1 | 3/2007 | Asthana et al. | |
| 2007/0053504 A1 | 3/2007 | Sato et al. | |
| 2007/0262062 A1 | 11/2007 | Guth | |
| 2007/0275263 A1 | 11/2007 | Groll | |
| 2008/0165485 A1 | 7/2008 | Zadesky et al. | |
| 2008/0166007 A1 | 7/2008 | Hankey et al. | |
| 2008/0241478 A1 | 10/2008 | Costin et al. | |
| 2008/0311369 A1 | 12/2008 | Yokoyama et al. | |
| 2008/0311370 A1 | 12/2008 | Tatarka | |
| 2009/0017242 A1 | 1/2009 | Weber et al. | |
| 2009/0091879 A1 | 4/2009 | Lim | |
| 2009/0104949 A1 | 4/2009 | Sato et al. | |
| 2009/0190290 A1 | 7/2009 | Lynch et al. | |
| 2009/0194444 A1 | 8/2009 | Jones | |
| 2009/0236143 A1 | 9/2009 | Nakamura | |
| 2009/0260871 A1 | 10/2009 | Weber | |
| 2009/0305168 A1 | 12/2009 | Heley et al. | |
| 2010/0015578 A1 | 1/2010 | Falsafi et al. | |
| 2010/0061039 A1 | 3/2010 | Sanford et al. | |
| 2010/0065313 A1 | 3/2010 | Takeuchi et al. | |
| 2010/0159273 A1 | 6/2010 | Filson et al. | |
| 2010/0159274 A1 | 6/2010 | Kleber | |
| 2010/0209721 A1 | 8/2010 | Irikura et al. | |
| 2010/0209722 A1 | 8/2010 | Yoshida | |
| 2010/0294426 A1 | 11/2010 | Nashner | |
| 2010/0300909 A1 | 12/2010 | Hung | |
| 2011/0008618 A1 | 1/2011 | Weedlun | |
| 2011/0048755 A1 | 3/2011 | Su et al. | |
| 2011/0051337 A1 | 3/2011 | Weber et al. | |
| 2011/0089039 A1 | 4/2011 | Nashner | |
| 2011/0089067 A1 | 4/2011 | Scott et al. | |
| 2011/0123737 A1 | 5/2011 | Nashner | |
| 2011/0155901 A1 | 6/2011 | Vestal | |
| 2011/0186455 A1 | 8/2011 | Du et al. | |
| 2011/0193928 A1 | 8/2011 | Zhang et al. | |
| 2011/0193929 A1 | 8/2011 | Zhang et al. | |
| 2011/0194574 A1 | 8/2011 | Zhang et al. | |
| 2011/0253411 A1 | 10/2011 | Hum et al. | |
| 2011/0315667 A1 | 12/2011 | Reichenbach et al. | |
| 2012/0043306 A1 | 2/2012 | Howerton et al. | |
| 2012/0081830 A1 | 4/2012 | Yeates et al. | |
| 2012/0100348 A1 | 4/2012 | Brookhyser et al. | |
| 2012/0248001 A1 | 10/2012 | Nashner | |
| 2012/0275130 A1 | 11/2012 | Hsu et al. | |
| 2012/0275131 A1 | 11/2012 | Huang et al. | |
| 2013/0075126 A1 | 3/2013 | Nashner et al. | |
| 2013/0083500 A1 | 4/2013 | Prest et al. | |
| 2019/0141848 A1 * | 5/2019 | Sung | G06F 1/1601 |
| 2019/0318710 A1 * | 10/2019 | Gurr | G06F 3/0346 |

FOREIGN PATENT DOCUMENTS

| | | |
|---|---|---|
| DE | 19523112 A1 | 6/1996 |
| DE | 102005048870 A1 | 4/2007 |
| EP | 0114565 A1 | 8/1984 |
| EP | 0633585 A1 | 1/1995 |
| EP | 0997958 A1 | 5/2000 |
| EP | 2 399 740 A1 | 12/2011 |
| GB | 788 329 A | 12/1957 |
| JP | 57-149491 A | 9/1982 |
| JP | 03 013331 A | 1/1991 |
| JP | 03 0138131 A | 6/1991 |
| JP | 03 203694 A | 9/1991 |
| JP | 06-126192 | 5/1994 |
| JP | 7-204871 A | 8/1995 |
| JP | 2000-000167 | 1/2000 |
| JP | 2003055794 | 2/2003 |
| JP | 2008 087409 | 4/2008 |
| WO | 98/53451 A1 | 11/1998 |
| WO | 2000/077883 A1 | 12/2000 |
| WO | 2001/015916 A1 | 3/2001 |
| WO | 2001/034408 A1 | 5/2001 |
| WO | 2006/124279 A2 | 11/2006 |
| WO | 2008/092949 A1 | 8/2008 |
| WO | 2009/051218 A1 | 4/2009 |
| WO | 2010/095747 A1 | 8/2010 |
| WO | 2010/135415 A1 | 11/2010 |
| WO | 2011/047325 A1 | 4/2011 |
| WO | 2011/049500 A1 | 4/2011 |

(56) References Cited

FOREIGN PATENT DOCUMENTS

OTHER PUBLICATIONS

"Thermal Shock Resistant Conformal Coating", Product Data Sheet, Dymax Corporation, Jul. 9, 2007, pp. 1-2.
"Marking Lasers: Marking without Limitations", TrumpfInc. brochure.
"UV-Curing Sheet Adhesives", ThreeBond Technical News, Issued Jul. 1, 2009, 8 pages.
Chang, "Lasers Make Other Metals Look Like Gold", New York Times, nytimes.com, 2 01rs., Jan. 31, 2008.
Lazov, Lyubomir & Deneva, Hristina & Narica, Pavels. (2015). Laser Marking Methods. Environment. Technology. Resources. Proceedings of the International Scientific and Practical Conference, vol. 1, 108-115.

* cited by examiner

Sparse, regularly spaced

Sparse, irregularly spaced

Sparse, irregularly spaced, irregular shape

SPARSE LASER ETCH ANODIZED SURFACE FOR COSMETIC GROUNDING

CROSS-REFERENCES TO RELATED APPLICATIONS

This application claims priority to U.S. Provisional Patent Application Ser. No. 62/733,855, filed Sep. 20, 2018, entitled "Sparse Laser Etch Anodized Surface For Cosmetic Grounding," which is herein incorporated by reference in its entirety and for all purposes.

FIELD

The described embodiments relate generally to electronic devices. More particularly, the present embodiments concern a mounting system for electronic devices.

BACKGROUND

Electrostatic discharge (ESD) is the sudden flow of electricity between two electrically charged objects caused by contact, an electrical short, or dielectric breakdown. ESD can cause failure of solid state electronic components such integrated circuits. Static electricity can build up on electronic devices and various conductive components. When an electronic device is mounted to another electronic device or to another component, inadvertent discharge of static electricity between the two devices can damage sensitive electronic components in the electronic device.

Accordingly, it is desirable to have a system for mounting an electronic device to a second device that can dissipate any static electricity that builds up on both of the devices.

SUMMARY

Some embodiments of the disclosure pertain to a mounting system that can mount a first electronic device to another device and provide a path for discharge of static electricity between the devices while maintaining a visually appealing connection surface and avoiding a metal-on-metal connection point that could otherwise result in corrosion and/or wear over time. In some embodiments, a first part of the mounting system is formed on a first device and includes a metallic layer covered by a cosmetic anodized layer with multiple micro-perforations formed through the anodized layer, each of which exposes a small portion of the underlying metallic layer. The micro-perforations can be formed by laser-etching the cosmetic anodized layer to provide a grounding path to the underlying metal layer while the micro-perforations are sufficiently small to remain practically or completely undetectable to an unaided human eye.

A second part of the mounting system can be formed on a second device that can be mounted to or otherwise connected to the first device. The second part of the mounting system can include a compressible semi-conductive wear layer formed on a second electronic device. The semi-conductive wear layer can be compressed against and coupled with the anodized layer of the first part of the mounting system such that portions of the semi-conductive wear layer are pressed into the micro-perforations and into electrical contact with the underlying metallic layer. In some embodiments, the compressible, semi-conductive wear layer can be formed in a recess of the second electronic device, and in some embodiments, the semi-conductive wear layer is made from a conformal conductive rubber.

In various embodiments the compressive force that compresses the semi-conductive wear layer against the anodized layer and into the micro-perforations can be produced by one or more connection components configured to attach and secure the mounting region of the first electronic device to the mounting region of the second electronic device. In some embodiments, at least some of the connection components can include one or more magnets, and in some embodiments, at least some of the connection components can include one or more mechanical latches.

Embodiments of the disclosure can be used to mount many different types of devices or components to each other. In some embodiments, the mounting system described herein can be used to mount a computer display to a stand for the display. In some embodiments, the mounting system design can be used in a modular server tower, a modular tower for a desktop computer or decouplable panels with a cosmetic interface.

In some embodiments, a mounting system for a device can include an electrically conductive layer; an anodized layer formed over the electrically conductive layer in a mounting region; a plurality of micro-perforations formed through the anodized layer in the mounting region exposing the metallic layer; and one or more connection components configured to attach and secure a second electronic device to the mounting region. The plurality of micro-perforations can provide a path for discharging a flow of static electricity through the mounting region when a second device is attached to the mounting region by the one or more connection components and thus mounted to the first device.

In some embodiments an electronic device according to the disclosure can include a mounting component having an electrically conductive metallic layer coupled to ground and an anodized metallic layer formed over the electrically conductive metallic layer in a mounting region; a plurality of micro-perforations formed through the anodized metallic layer exposing the electrically conductive metallic layer in the mounting region; and one or more connection components configured to attach and secure the mounting region of the device to a second device.

In some embodiments an electronic system according to the disclosure can include a first electronic device that can be attached to a mounting region of a second device. The first electronic device can include a first device housing; one or more electronic components disposed within the first device housing; a connection region located at an exterior surface of the second device housing, the connection region including a compressible semi-conductive wear layer; and one or more first device connection components configured to align the connection region of the first electronic device with the mounting region of the second device. The second device can include a second housing having an anodized metallic layer formed over at least a portion of an exterior surface including the mounting region, an electrically conductive metallic layer directly below the anodized metallic layer, a plurality of micro-perforations formed through the anodized metallic layer exposing the electrically conductive metallic layer in the mounting region, and one or more second device connection components configured to cooperate with the first device connection components to attach and secure the connection region of the first electronic device to the mounting region of the second device such that portions of the compressible semi-conductive wear layer are pressed into the plurality of micro-perforations providing a path for discharging a flow of static electricity between the first electronic device and the second device.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

The included drawings are for illustrative purposes and serve only to provide examples of possible structures and arrangements for the disclosed inventive apparatuses and methods for providing portable computing devices. These drawings in no way limit any changes in form and detail that may be made to the invention by one skilled in the art without departing from the spirit and scope of the invention. The embodiments will be readily understood by the following detailed description in conjunction with the accompanying drawings, wherein like reference numerals designate like structural elements, and in which.

DETAILED DESCRIPTION

Embodiments of the disclosure relate to mounting devices for electronic devices such as a display system, a monitor, a tower, or a server etc. The mounting system can couple one electronic device with another electronic device and provide for a discharge of static electricity that can accumulate on the one or more devices. The mounting system can provide quick connect features to enable the electronic devices to be quickly connected and disconnected without damaging the finished exterior of the electronic devices. The mounting system can also present an aesthetically appealing surface finish in both the coupled and decoupled configurations. These general subjects are set forth in greater detail below.

Figure 1:
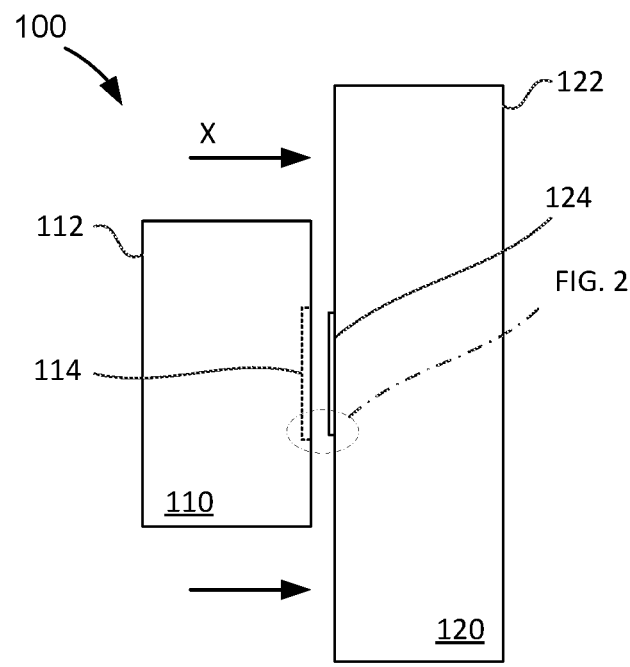
FIG. 1 is a simplified side plan view of a mounting system according to some embodiments.

FIG. 1 is a simplified side plan view of a mounting system 100 according to some embodiments of the disclosure. In various embodiments, the mounting system can be part of an electronic system. Mounting system 100 can connect or mount a first electronic device 110 having a first device housing 112 to a second device 120 having a second device housing 122. At least one of first device 110 and second device 120 can include one or more electronic components that are susceptible to damage from an electrostatic discharge event enclosed within its device housing. Embodiments of the disclosure provide a safe discharge path for static electricity that could cause such an ESD event, providing protection to electronic components within either or both of devices 110 and 120 against such an ESD event. In some embodiments both devices 110 and 120 can include electronic components that are susceptible to ESD events. In other embodiments just one of the devices 110 or 120 includes such electronic components while the other of devices 110 or 120 includes a housing or other component that can be a source of static electricity.

Device 110 can include a mounting region 114 and device 120 can include a mounting region 124. Mounting regions 114 and 124 can cooperate to enable device 110 to be mounted or otherwise mechanically connected to device 120 (for example, by aligning mounting regions 114 and 124 with each other and moving device 110 in direction X towards device 120 until the two devices are in contact with each other). As shown in FIG. 1, mounting region 114 can be formed in a recessed cavity portion of housing 112 while mounting region 124 can be formed on a surface that protrudes slightly from housing 122 of device 120. Embodiments of the disclosure are not limited to such an implementation, however, and in other embodiments the mounting regions can be generally flush with an external housing of devices 110 and/or 120, can be contoured in complementary shapes or can otherwise be configured to come in direct contact with each other.

Figure 2:
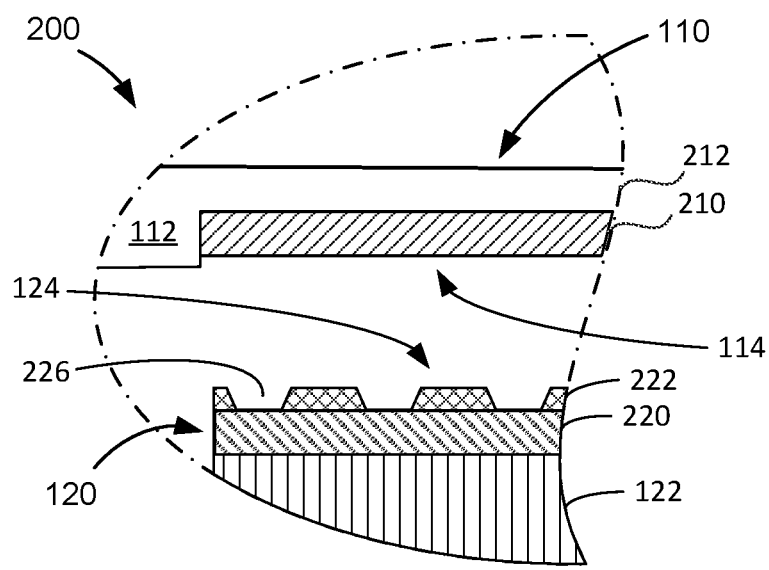
FIG. 2 is a simplified expanded cross-sectional view of a portion of the mounting system shown in FIG. 1.

FIG. 2 is a simplified, expanded cross-sectional view of a portion 200 of mounting system 100 according to an exemplary embodiment. In FIG. 2, mounting system 100 is shown in a position such that device 110 is not mounted to device 120. Instead, the mounting regions 114 and 124 of each device are slightly spaced apart from each other in a position in which they can subsequently be moved towards and compressed into each other to physically attach, or mount, device 110 to device 120 as described herein. Due to the expanded nature of FIG. 2, which is not drawn to scale, features on the mating surfaces of each of mounting regions 114, 124 of devices 110 and 120, respectively, are shown. Specifically, as shown in FIG. 2, mounting region 114 of device 110 can include a compressible, semi-conductive layer 210 at a surface of mounting region 114 and mounting region 124 of device 120 can include an anodized layer 222 formed over an electrically conductive metallic layer 220. The metallic layer 102 can be a layer of conductive metal (e.g., aluminum or an aluminum alloy) and can be covered, at least in part, by anodized layer 222, such as an anodized aluminum alloy layer. Anodizing is an electrolytic passivation process used to increase the thickness of the natural oxide layer on the surface of metal parts. Anodizing increases resistance to corrosion and wear and can present an aesthetically appealing visual surface.

In some embodiments, a plurality of micro-perforations 226 can be formed in the anodized layer 222 that extend through anodized layer 222 to metallic layer 220. The number of, size of, and total area of micro-perforations 226 that extend to and exposed metallic layer 220 can vary depending on the size and ESD requirements of the electronic devices. In some embodiments, the surface area exposed can be around 40 square millimeters. The larger the total area of the micro-perforations 226, the sparser the pattern can be and still provide sufficient connectivity for static discharge. If there is a very large mating surface for the anodized layer, the pattern can be very sparse. If there is a relatively small mating surface for the anodized layer, the pattern can be more compressed. In some embodiments, the mounting system 100 can comprise multiple connection paths, where the multiple connection paths would act as a single path with a larger surface area. In some embodiments, the micro-perforations 226 can be laser-etched in the anodized layer 222 and a diameter for ones of the micro-perforations 226 can range from 10 microns to 30 microns.

The micro-perforations 226 can be sufficiently small to prevent the accumulation of materials such as dirt or dust from blocking the micro-perforations 226. In addition the micro-perforations 226 can be sufficiently small that they are not apparent to visual detection by the unaided human eye. However, the micro-perforations 226 need to be large enough for passing through at least a portion of the compressible, semi-conductive wear layer 210. At some minimum size, materials, such as conformal rubber, stop acting in a sufficiently flexible manner to pass through the micro-perforations 226. In some embodiments, the micro-perforations 226 can be irregularly shaped. In some embodiments, the micro-perforations 226 can be cut at an angle to visually obfuscate the micro-perforations 226 when observed from certain angles.

The semi-conductive wear layer 210 can be formed over a second conductive surface, such as metal wall 212, via a conductive adhesive in a connective region. In some embodiments the semi-conductive wear layer 210 can be a conformal conductive rubber that can be forced through the micro-perforations 226 when electronic device 110 is coupled with device 120. In some embodiments, the semi-conductive wear layer 210 facilitates the flow of static electricity from electronic device 110 to the metallic layer 220 of the device 120. The metallic layer 220 can be connected to ground, which enables the static charge to be dissipated to ground.

Shore Hardness is a measure of the hardness of a given material or how resistant it will be to permanent indentation. It is measured by the depth of indentation that is created on the material with a specified force. Accordingly, there are different Shore Hardness scales for measuring the solidity of different materials with varying properties, like rubbers, polymers and elastomers. There can be as many as 12 different scales depending on the intended use, and each scale results in a value between 0 and 100. The higher Shore Hardness values indicate higher hardness and the lower values indicate lower hardness with increased flexibility. Two scales are most commonly used for measuring the hardness of rubber compounds. The "A scale" can be used for softer materials. The "D scale" can be used for harder ones. Shore A Hardness Scale is used for measuring the hardness of flexible mold rubbers. The hardness values can range in hardness from very soft and flexible, to medium and somewhat flexible, to hard with almost no flexibility at all. A Shore A0 rating can denote extremely soft and gel-like rubbers. While semi-rigid plastics will be measured at the highest end of the Shore A Scale. The stiffer the shore rating of the conformal rubber, the more difficult it will be to fit the conformal rubber through the smaller micro-perforations. In some embodiments, the shore rating for the conformal conductive rubber is 55 A or below, which can be characterized as medium soft to extra soft.

The semi-conductive wear layer 210 can be composed of a conductive elastomer. A conductive elastomer is a form of elastomer, often natural rubber or other rubber substitute, that is manufactured to conduct electricity. This can be accomplished by distributing carbon or other conductive particles throughout the raw material prior to setting it. Conductive elastomers can be pressure-sensitive, with their conductivity varying with the amount of pressure put on it. The semi-conductive wear layer 210 can also have a bulk connectivity measurement to measure the conductivity of the material. In some embodiments, the semi-conductive wear layer 108 can have a bulk connectivity on the order of 10^4 ohms per square inch.

Figure 3:
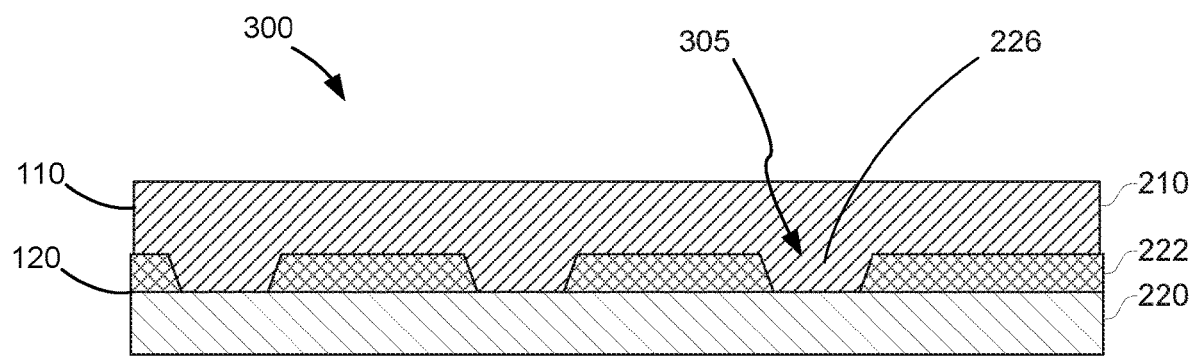
FIG. 3 shows a cross-sectional view of a mounting system according to an exemplary embodiment.

FIG. 3 is a simplified cross-sectional view of a portion 300 of mounting system 100 in regions 114, 124 when device 110 is mounted to device 120. As shown in FIG. 3, when devices 110 and 120 are mechanically attached to each other by mounting system 100, portions 305 of compressible semi-conductive layer 210 are forced into micro-perforations 226 of anodized layer 222 such that electrical pathways are formed between layer 210 and metallic layer 220.

Figure 4:
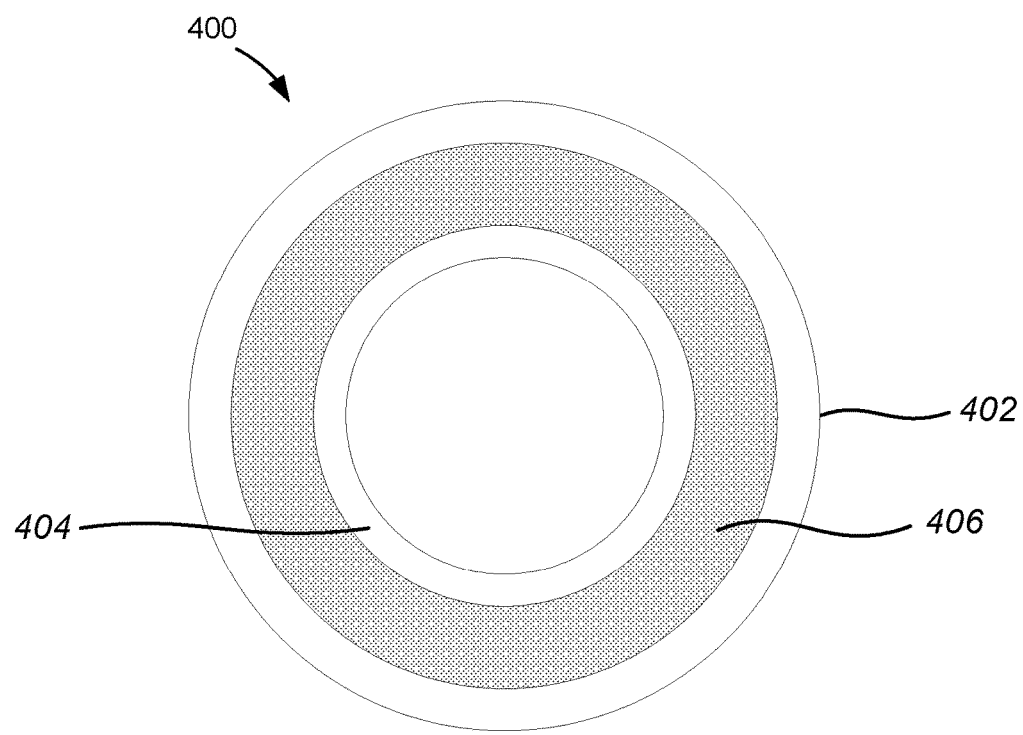
FIG. 4 shows an illustration of a top view of the mounting system of FIG. 1 according to an exemplary embodiment.

Mounting regions 114, 124 can be arranged in a variety of different shapes or patterns. As one example, FIG. 4 is a simplified illustration of a mounting region 400 in the shape of a ring that can be representative of mounting region 124 according to some embodiments of the disclosure. Mounting region 400 includes an anodized region mounting region 406 formed between an outer ring 402 and an inner ring 404. Anodized region 406 is formed over a metallic layer (not shown in FIG. 4) and includes multiple micro-perforations distributed across its surface as discussed herein with respect to FIGS. 2, 3 and others. Mounting region 400 can be sized and shaped to be received by a recessed mounting region of a second device. For example, outer ring 402 can be sized and shaped to fit within the recess of another device so that mounting region 400 can be coupled to a corresponding mounting region in the second device. In other embodiments, mounting region 400 can be recessed within the housing of a first device and sized and shaped to receive an protruding mounting region from a second electronic device. In still other embodiments, mounting region 400 can be flush with an exterior surface of a device.

Embodiments of the disclosure are not limited to any particular shape for either mounting region 114 or 124. In general the two regions have complementary shapes so that the compressible, semi-conductive material in mounting region 114 aligns with micro-perforations through the anodized layer in mounting region 124. In other embodiments, the mounting regions can be a solid circular surface instead a ring with a central opening or can have other geometric shapes including but not limited to a square shape, a rectangular shape, or a patterned shape, for example, in the form of a logo or one or more letters or numbers.

In some embodiments mounting region 400 can be part of a component such as a stand for a display or docking station. In other embodiments mounting region can be part of an electronic device, such as a computer display, a tablet computer, an all-in-one computer or other device.

Figure 5:
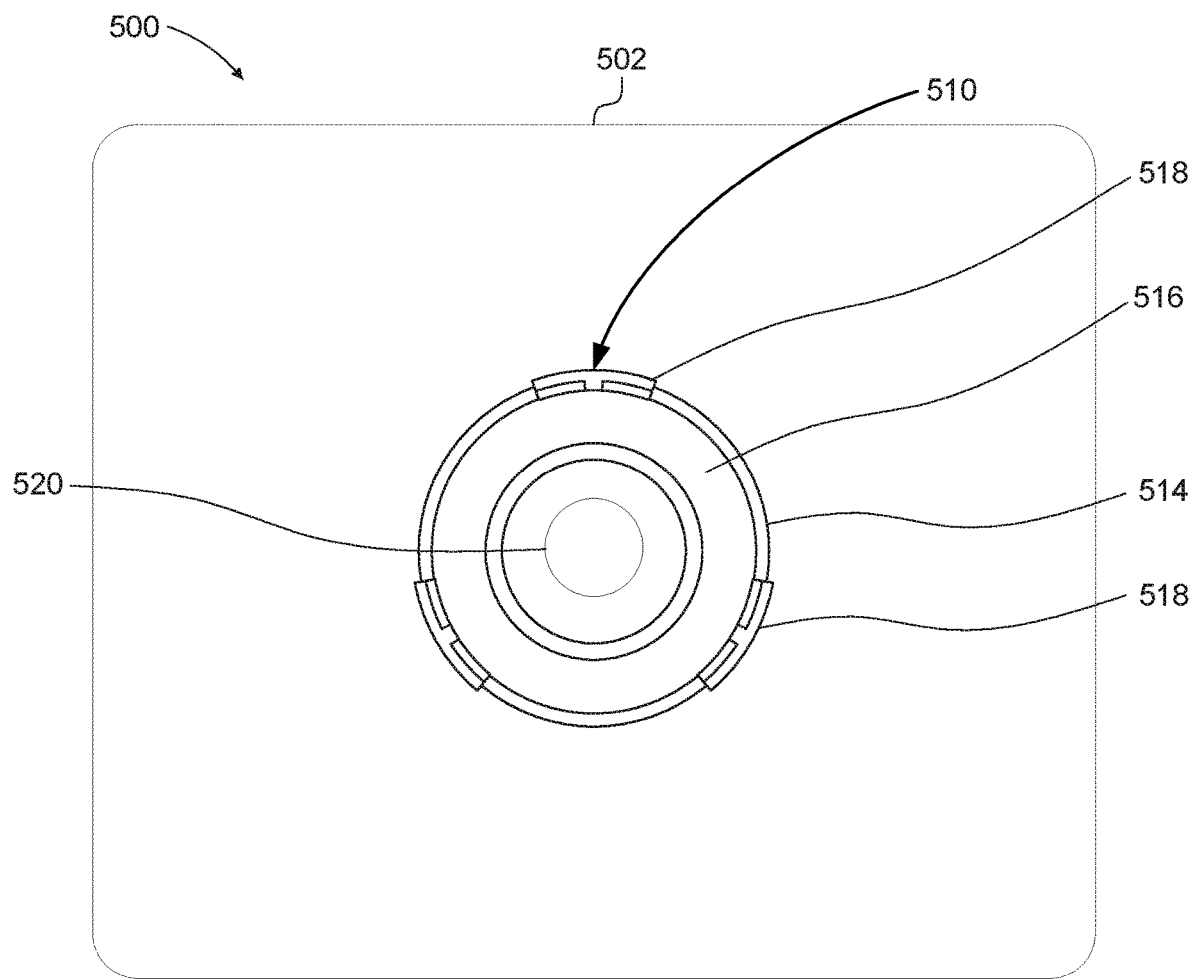
FIG. 5 shows an illustration of a back view of an electronic device with a mounting system according to an exemplary embodiment with the electronic device coupled.

FIG. 5 shows an illustration of a back view of an exemplary electronic device 500 with a mounting system according to an embodiment of the disclosure. In some embodiments, the electronic device 500 can include a housing 502 that encloses various electronic components and houses an electronic display (not shown in FIG. 5) one side and has a mounting component 510 coupled to the opposing side. Mounting component 510 can include a recess 514 that can be configured to receive a corresponding mounting region, such as mounting region 400 (shown in FIG. 4). In some embodiments, the recess 514 can include a semi-conductive wear layer 516. The semi-conductive wear layer 516 can provide a cushioning layer to avoid metal on metal contact between the devices when coupling. Using a semi-conductive wear layer 516 allows the material of the wear layer 516 to expand into the micro-perforations on the anodized layer 406 (shown in FIG. 4). In some embodiments, the semi-conductive wear layer 516 can be a layer of conformal conductive rubber as discussed above.

In some embodiments, display 500 can be mounted to a display stand that includes a mounting region 400 as described with respect to FIG. 4. When mounted as such, portions of semi-conductive wear layer 516 can be forced through micro-perforations in anodized layer 406 (shown in FIG. 4), which can facilitate the flow of static electricity from display device 500 to the display stand via metallic layers beneath anodized layer 406 and semi-conductive layer 516 as described in conjunction with FIGS. 2 and 3.

In some embodiments, the housing 502 can have one or more connection components 518 configured to couple and secure a mounting region of the electronic device 500 to a second device (e.g., a display stand, not shown). In some embodiments, the one or more device connection components 518 can include a latch. In some embodiments, the mounting component can include one or more magnets 520 in addition to or instead of connection components 518. In some embodiments, the magnets 520 can be configured for far field attraction to assist in guiding the housing 502 during coupling with the second device and be strong enough to hold display device 500 in place when mounted to the second device. Once display 500 is then initially mounted to the second device, connection components 518 can be used to further secure the display to the second device (e.g., device stand) and further compress portions of semi-conductive wear layer 516 into the micro-perforations formed in the anodized layer 406. While FIG. 5 depicts the mounting component 510 of the housing 502 as being circular, mounting region 510 can be any another geometric shape including but not limited to a square, a rectangle, or a patterned shape and generally will have a shape that complements that of its corresponding mounting region, for example, mounting region 400.

Figure 6:
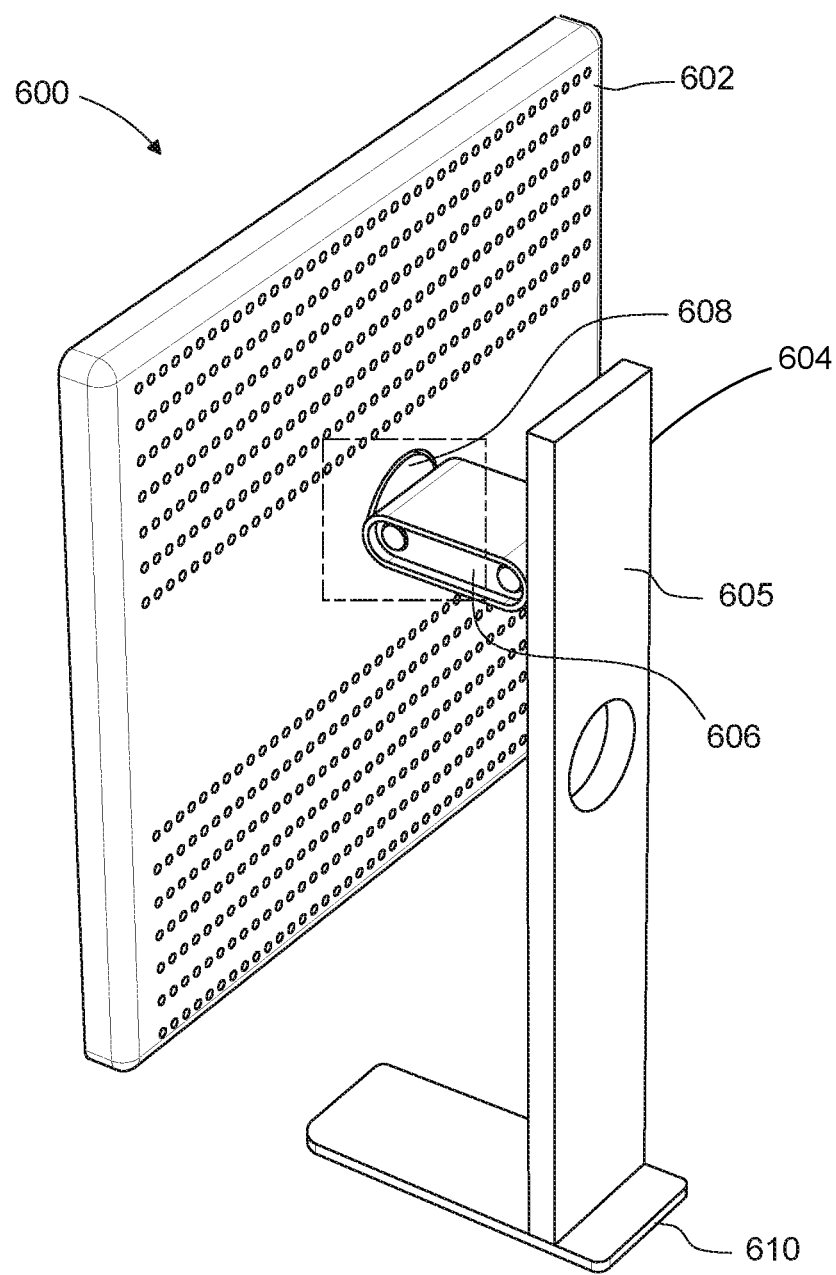
FIG. 6 shows an exemplary embodiment of an electronic with a mounting system.

FIG. 6 shows an exemplary embodiment of an electronic device 600 with a mounting system. In some embodiments, the electronic device 600 can include a display 602 and a stand 604 that can support the display in one or more viewing positions. Stand 604 can includes a body 605, an extension arm 606, a mounting system 608, and a base 610. Mounting system 608 can include two separate components: a first mounting component that is part of display 602 and a second mounting component that is part of stand 604 and that is complementary to the first mounting component enabling display 602 to be physically attached to (i.e., mounted to) stand 604. In some embodiments, mounting component 510 shown in FIG. 5 can be representative of the first mounting component, while mounting component 400 shown in FIG. 4 can be representative of the second mounting component.

The display 602 can include sensitive electronic components and can develop a static charge on the housing or other portions of display 602. The body 605 can be connected to an extension arm 606 and a base 610. The base 610 can have sufficient mass to offset the mass of the display 602 when coupled. The mounting system 608 enables the display 602 to be attached and removed from the attachment arm 606 of the stand 604. In some embodiments, the base 610 can have a plurality of feet (not shown). In some embodiments, the feet are constructed from a non-conductive plastic material. In such embodiments the stand can also develop a static charge often just from airflow over the surface of the stand 604. Without adequate ESD protection, such as that provided by the present disclosure, when the display 602 is mounted to the stand 604, this built up charge can be discharged from the stand 604 into the display 602 resulting in a temporary spike in the display ground as the pulse comes through it which can damage sensitive electronic components within the display 602. Mounting system 608 enables static charge that has built up on either or both of display 602 and stand 604 to be dissipated to ground when the display 602 is attached to the stand 604 thus protecting the various electronic components within display 602.

Figure 7:
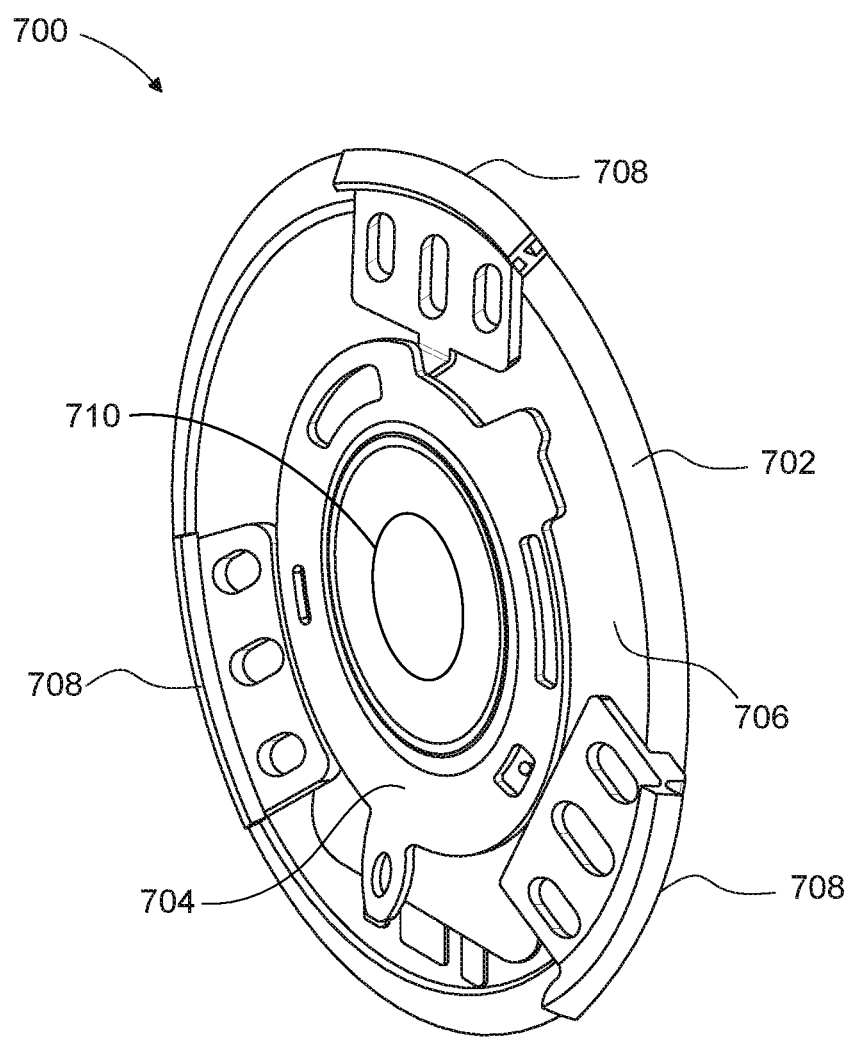
FIG. 7 shows an exemplary detailed view of a mounting system.

FIG. 7 shows an exemplary detailed view of a mounting component 700 that can be, for example, representative of the second mounting component of mounting system 608 discussed above. In some embodiments, the mounting component 700 includes an outer retainer ring 702, a latch mechanism 704, and a metallic layer (not shown) underlying an anodized surface 706. In some embodiments, the outer retainer ring 702 can be constructed from a metallic or plastic material. Between the outer retainer ring 702 and the latch mechanism 704 is the anodized surface 706. In some embodiments, the anodized surface 706 can be made from an aluminum alloy. In some embodiments, the anodized surface 706 can have a plurality of micro-perforations 326 (shown in FIG. 3) that extend completely through the anodized surface 706 to an underlying metallic layer (not visible in FIG. 7). In some embodiments, the mounting component 700 can be configured to be received within a recessed mounting region of second device, such as display 602 (shown in FIG. 6), and mechanically mounted to a mounting component of the second device. In some embodiments, the mounting component 700 can have one or more connection components 708 configured to attach and secure the mounting component 700 of the device it is part of (e.g., a display stand) to a second electronic device (e.g., a display 602, shown in FIG. 6). In some embodiments, the latch mechanism 704 can rotate and the rotation of the latch mechanism 704 can cause the one or more connection components 708 to move radially inward to retract allowing the first device to be removed. In various embodiments, the connection components 708 can be configured to automatically lock. In some embodiments, mounting component 700 can also include a magnet 710 that can facilitate alignment and connection of the second electronic device to component 700.

Figure 8:
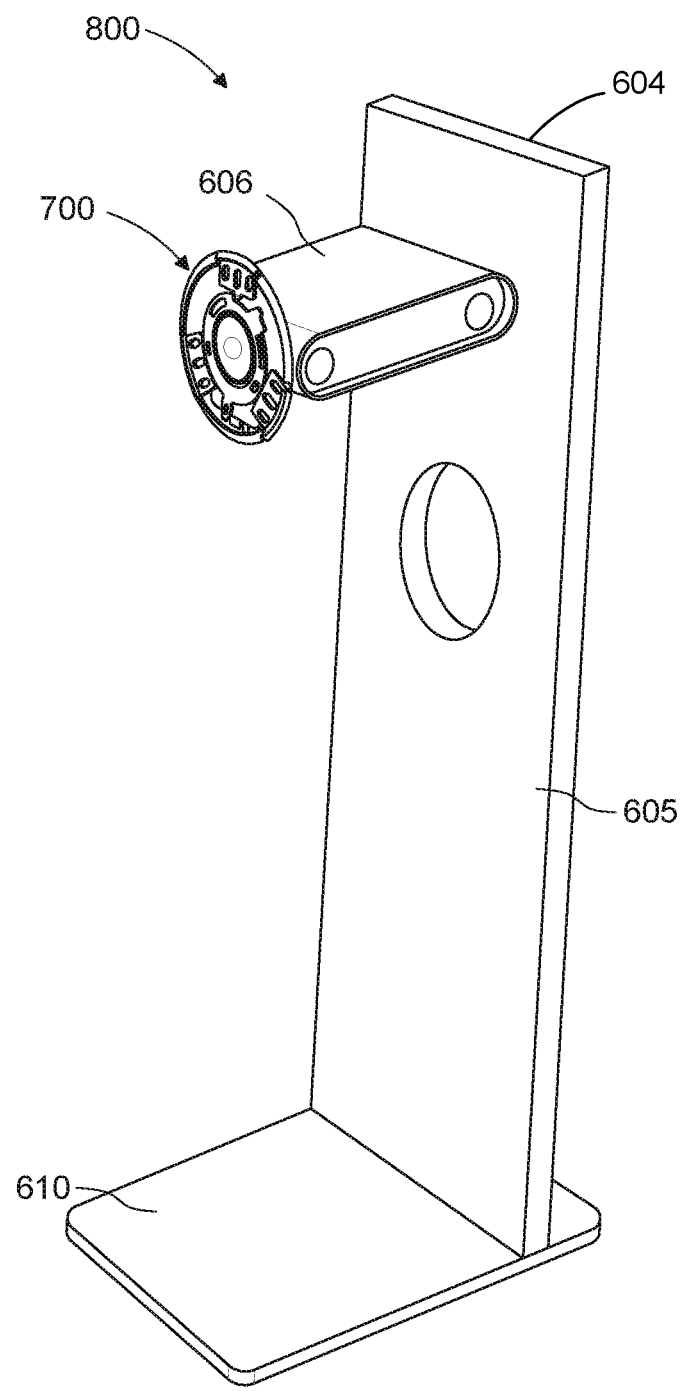
FIG. 8 shows an exemplary view of a mounting system with the electronic device uncoupled.

FIG. 8 shows an exemplary view of a portion 800 of mounting system 608 on stand 604 without display 602 attached to the stand 604. As shown in FIG. 8, the mounting system 800 can include mounting component 700 at the end of extension arm 606. In some embodiments, the mounting system 608 can allow for quick disconnect of a first electronic device (e.g., a display 500) from a second device (e.g., a stand 604). The display 500 can include a plurality of grooves that fit onto the mounting component 700 of the stand 604. In some embodiments, the display 500 can be lowered vertically towards and onto the latches of the mounting component 700 with the one or more magnets 710 providing a guiding force for aligning the mounting component 510 of display 500 to mounting component 700 of stand 604 once the display is within the magnetic field. Once the display 500 is lowered into the mounting component 700 of the stand 604, the latches can be configured to auto-lock. A manual lever, not shown, can then be used to unlock the display 500 so that it can be removed from the stand 604. In addition to securing the display 500 to the stand 604, the latches apply a compressive force between the latches and one or more connection points of mounting component 510 of display 500 helping to force the compressible, semiconductive layer of mounting component 510 into the micro-perforations formed through the anodized layer of the mounting component 700.

Figure 9:
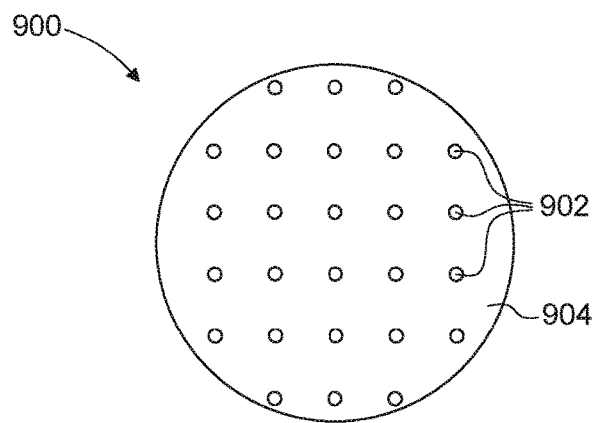
FIG. 9 shows an illustration of a mounting surface with sparse, regularly spaced micro-perforations.

As discussed above, the micro-perforations of a mounting component according to embodiments of the disclosure can be distributed across a mounting region of a mounting component, such as component 700, in either a regular or irregular pattern and/or according to either different pattern densities depending on how much current the mounting components need to be able to conduct in order to adequately discharge static electricity between the devices. FIG. 9 shows an illustration of a mounting surface with sparse, regularly spaced micro-perforations. The mounting surface 900 in FIG. 9 depicts a plurality of micro-perforations 902 in an anodized surface 904. The micro-perforations 902 in FIG. 9 can have a sparse, regularly spaced pattern. In some embodiments, the pitch for the micro-perforations can be 9 mm to 0.2 mm pitch with a diameter of each micro-perforation 902 from 10 to 30 microns. In some embodiments, the regularly spaced pattern can be closer together or spaced further apart than illustrated in FIG. 9.

Figure 10:
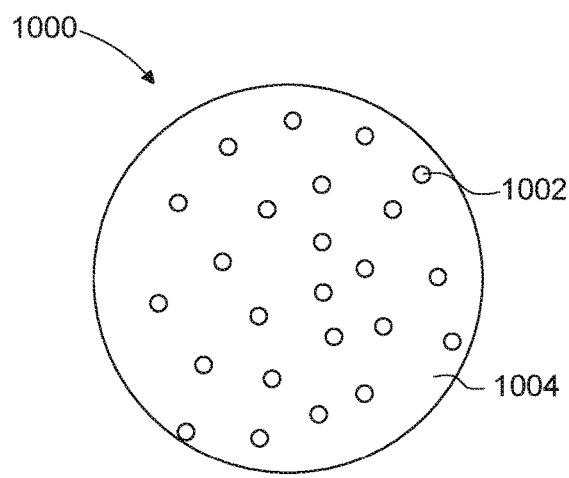
FIG. 10 shows an illustration of a mounting surface with sparse, irregularly spaced micro-perforations.

FIG. 10 shows an illustration of a mounting surface with sparse, irregularly spaced micro-perforations. The mounting surface 1000 in FIG. 10 depicts a plurality of micro-perforations 1002 in an anodized surface 1004. The micro-perforations 1002 in FIG. 10 can have a sparse, irregularly spaced pattern. The irregular spaced pattern illustrated in FIG. 10 can be easier to laser-etch than the regularly spaced pattern of FIG. 7. The density of the pattern of micro-perforations 1002 can determine the efficiency in reducing static electricity between one or more electronic devices.

Figure 11:
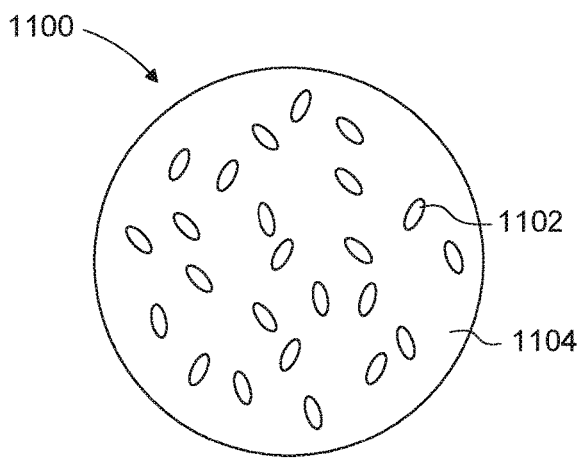
FIG. 11 shows an illustration of a mounting surface with sparse, irregularly spaced, and irregularly shaped micro-perforations.

FIG. 11 shows an illustration of a mounting surface with sparse, irregularly spaced, and irregularly shaped micro-perforations. The mounting surface 1100 in FIG. 11 depicts a plurality of micro-perforations 1102 in an anodized surface 1104. The micro-perforations 1102 in FIG. 11 can have a sparse, irregularly spaced pattern with the micro-perforations 1102 can have irregular shape. The irregularly shaped pattern depicted in FIG. 11 can allow for improved connectivity for the semi-conductive wear layer 106, shown in FIG. 1. The size of the irregularly shaped micro-perforations 802 can determine the efficiency in reducing static electricity between one or more electronic devices.

Representative applications of apparatuses and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

Although the foregoing invention has been described in detail by way of illustration and example for purposes of clarity and understanding, it will be recognized that the above described invention may be embodied in numerous other specific variations and embodiments without departing from the spirit or essential characteristics of the invention. For example, while the embodiments discussed above with respect to FIGS. 1-9 included a display and a stand, the embodiments can include one or more electronic devices. While the embodiments disclose an anodized layer including an aluminum alloy, any of a multiple of anodized metallic layers can be used. While the metallic layer may be a copper layer, any of a number of conductive metals can be used.

Additionally, spatially relative terms, such as "bottom" or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A mounting system for an electronic device, the mounting system comprising:
   an electrically conductive layer;
   an anodized layer formed over the electrically conductive layer in a mounting region;
   a plurality of micro-perforations formed through the anodized layer in the mounting region exposing the electrically conductive layer; and
   one or more connection components configured to attach and secure a second electronic device to the mounting region.

2. The mounting system of claim 1 wherein the plurality of micro-perforations provide a path for discharging a flow of static electricity through the mounting region when the second electronic device is attached to the mounting region by the one or more connection components.

3. The mounting system of claim 1 wherein the one or more connection components includes a plurality of magnets configured to facilitate alignment of the second electronic device to the mounting region.

4. The mounting system of claim 1 wherein the one or more connection components includes a plurality of latches disposed around the mounting region.

5. The mounting system of claim 1 wherein the plurality of micro-perforations are formed through the anodized layer at a non-perpendicular angle.

6. The mounting system of claim 1 wherein a diameter of one of the plurality of the micro-perforations is between 10 and 30 microns.

7. The mounting system of claim 1 wherein the one of the plurality of micro-perforations is irregularly shaped.

8. An electronic device comprising:
a mounting component having an electrically conductive metallic layer coupled to ground and an anodized metallic layer formed over the electrically conductive metallic layer in a mounting region;
a plurality of micro-perforations formed through the anodized metallic layer exposing the electrically conductive metallic layer in the mounting region; and
one or more connection components configured to attach and secure the mounting region of the electronic device to a second device.

9. The electronic device of claim 8 wherein the mounting component is part of a stand for a display.

10. The electronic device of claim 9 wherein the stand comprises a base, a body coupled to and extending away from the base and an arm coupled to and extending away from the body, and wherein the mounting component is coupled to a distal end of the arm.

11. The electronic device of claim 9 wherein the plurality of micro-perforations are configured to facilitate a flow of static electricity through the mounting region when the second device is attached to the mounting region by the one or more connection components.

12. The electronic device of claim 9 wherein the plurality of micro-perforations are formed through the anodized metallic layer at a non-perpendicular angle.

13. The electronic device of claim 9 wherein the one or more connection components comprise a plurality of magnets.

14. The electronic device of claim 13 wherein the one or more connection components further includes a plurality of latches disposed around the mounting region.

15. An electronic system comprising:
a first electronic device that is configured to be attached to a mounting region of a second device;
the first electronic device comprising a first device housing; one or more electronic components disposed within the first device housing; a connection region located at an exterior surface of the first device housing, the connection region including a compressible semi-conductive wear layer; and one or more first device connection components configured to align the connection region of the first electronic device with the mounting region of the second device; and
the second device comprising a second housing having an anodized layer formed over at least a portion of an exterior surface of the second device including the mounting region, an electrically conductive layer directly below the anodized layer, a plurality of micro-perforations formed through the anodized layer exposing the electrically conductive layer in the mounting region, and one or more second device connection components configured to cooperate with the first device connection components to attach and secure the connection region of the first electronic device to the mounting region of the second device such that portions of the compressible semi-conductive wear layer are pressed into the plurality of micro-perforations providing a path for discharging a flow of static electricity between the first electronic device and the second device.

16. The electronic system of claim 15 wherein the plurality of micro-perforations are formed through the anodized layer at a non-perpendicular angle.

17. The electronic system of claim 15 wherein a diameter of each micro-perforation in the plurality of the micro-perforations is between 10 and 30 microns.

18. The electronic system of claim 15 wherein the micro-perforations are irregularly shaped.

19. The electronic system of claim 15 wherein the one or more first device connection components comprise a plurality of magnets.

20. The electronic system of claim 15 wherein the compressible semi-conductive wear layer comprises conformal conductive rubber.

* * * * *